(12) United States Patent
Hamada et al.

(10) Patent No.: US 11,710,940 B2
(45) Date of Patent: *Jul. 25, 2023

(54) SEMICONDUCTOR OPTICAL DEVICE

(71) Applicant: Lumentum Japan, Inc., Kanagawa (JP)

(72) Inventors: Shigetaka Hamada, Kanagawa (JP); Yasushi Sakuma, Tokyo (JP); Kouji Nakahara, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/654,841

(22) Filed: Mar. 15, 2022

(65) Prior Publication Data

US 2022/0200243 A1 Jun. 23, 2022

Related U.S. Application Data

(63) Continuation of application No. 16/588,167, filed on Sep. 30, 2019, now Pat. No. 11,283,242.

(30) Foreign Application Priority Data

Aug. 13, 2019 (JP) .................................. 2019-148456

(51) Int. Cl.
*H01S 5/22* (2006.01)
*H01S 5/028* (2006.01)
*H01S 5/042* (2006.01)

(52) U.S. Cl.
CPC .............. *H01S 5/22* (2013.01); *H01S 5/0282* (2013.01); *H01S 5/0425* (2013.01)

(58) Field of Classification Search
CPC .... H01S 5/0282; H01S 5/0425; H01S 5/2213; H01S 2301/185; H01S 5/2224; H01S 5/2202; H01S 5/22

(Continued)

(56) References Cited

U.S. PATENT DOCUMENTS

2003/0064536 A1 4/2003 Yamada
2008/0225919 A1 9/2008 Krakowski et al.

(Continued)

FOREIGN PATENT DOCUMENTS

JP 2003174234 A 6/2003
JP 2004055688 A 2/2004

(Continued)

*Primary Examiner* — Tuan N Nguyen
(74) *Attorney, Agent, or Firm* — Harrity & Harrity, LLP

(57) ABSTRACT

A semiconductor optical device may include a semiconductor substrate; a mesa stripe structure that extends in a stripe shape in a first direction on the semiconductor substrate and includes a contact layer on a top layer; an adjacent layer on the semiconductor substrate and adjacent to the mesa stripe structure in a second direction orthogonal to the first direction; a passivation film that covers at least a part of the adjacent layer; a resin layer on the passivation film; an electrode that is electrically connected to the contact layer and extends continuously from the contact layer to the resin layer; and an inorganic insulating film that extends continuously from the resin layer to the passivation film under the electrode, is spaced apart from the mesa stripe structure, and is completely interposed between the electrode and the resin layer.

20 Claims, 8 Drawing Sheets

(58) Field of Classification Search
USPC .................................................. 372/44.01
See application file for complete search history.

(56) References Cited

U.S. PATENT DOCUMENTS

| | | | |
|---|---|---|---|
| 2010/0273302 A1 | 10/2010 | Asami | |
| 2013/0273677 A1 | 10/2013 | Shouji et al. | |
| 2018/0287339 A1* | 10/2018 | Nakanishi | H01S 5/2275 |
| 2021/0050713 A1 | 2/2021 | Hamada et al. | |

FOREIGN PATENT DOCUMENTS

| | | |
|---|---|---|
| JP | 2005175382 A | 6/2005 |
| JP | 2011009456 A | 1/2011 |

* cited by examiner

SEMICONDUCTOR OPTICAL DEVICE

CROSS-REFERENCE TO RELATED APPLICATION

This application is a continuation of U.S. patent application Ser. No. 16/588,167, filed Sep. 30, 2019 (now U.S. Pat. No. 11,283,242), which claims priority to Japan Patent Application No. 2019-148456, filed on Aug. 13, 2019, the contents of each of which are incorporated herein by reference in their entireties.

TECHNICAL FIELD

The present disclosure relates to a semiconductor optical device.

BACKGROUND

A structure in which a resin layer (such as polyimide layer) having a dielectric constant lower than that of a semiconductor is disposed under a pad electrode to reduce parasitic capacitance due to the pad electrode to be wire-bonded is known. Adhesion strength between the pad electrode including a metal film and the resin layer may be weakened and the pad electrode may be peeled off in a process of wire bonding. Accordingly, an inorganic insulating film, such as SiN, may be interposed between the top surface of the resin layer and the pad electrode.

In the process of forming the pad electrode on the top surface of the resin layer, the resin layer is formed on the entire surface of the semiconductor optical device, the inorganic insulating film is formed on the entire surface of the resin layer, the inorganic insulating film is patterned, and the resin layer is then etched using photoresist. As etching of the resin layer proceeds, the photoresist also becomes smaller, and thus the inorganic insulating film is exposed and the resin layer is etched using the inorganic insulating film as a mask. Therefore, the top surface of the resin layer is lowered, and a large difference in height (step) occurs between the resin layer and the inorganic insulating film. The step causes disconnection of electrodes (pad electrode and electrode connected thereto) to be formed later.

An object of the present disclosure is to provide a semiconductor optical device in which an electrode is adhered to a resin layer without deteriorating the characteristics and reliability.

SUMMARY

According to some possible implementations, a semiconductor optical device may include a semiconductor substrate; a mesa stripe structure that extends in a stripe shape in a first direction on the semiconductor substrate and includes a contact layer on a top layer; an adjacent layer on the semiconductor substrate and adjacent to the mesa stripe structure in a second direction orthogonal to the first direction; a passivation film that covers at least a part of the adjacent layer; a resin layer on the passivation film; an electrode that is electrically connected to the contact layer and extends continuously from the contact layer to the resin layer; and an inorganic insulating film that extends continuously from the resin layer to the passivation film under the electrode, is spaced apart from the mesa stripe structure, and is completely interposed between the electrode and the resin layer.

According to some possible implementations, a semiconductor optical device may include a mesa stripe structure that includes a contact layer; an adjacent layer adjacent to the mesa stripe structure; a passivation film that covers at least a part of the adjacent layer; a resin layer on the passivation film; an electrode that is electrically connected to the contact layer and extends continuously from the contact layer to the resin layer; and an inorganic insulating film that extends from the resin layer to the passivation film under the electrode.

DETAILED DESCRIPTION

Figure 1:
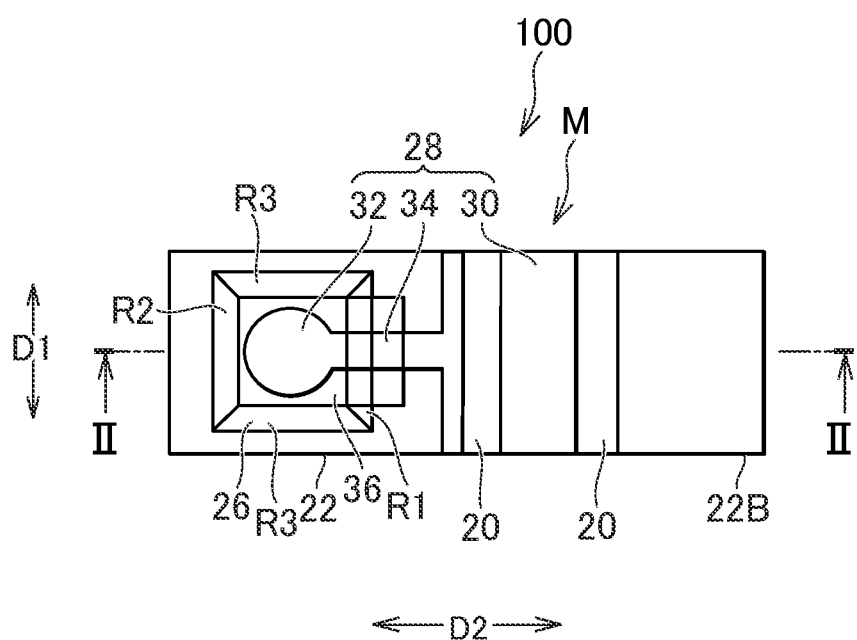
FIG. 1 is a plan view of a semiconductor optical device.

Hereinafter, some embodiments will be described specifically and in detail with reference to drawings. In all the drawings to explain the embodiments, the members with the identical or same function bear the same reference numerals, and their repetitive description will be omitted. The drawings used below are only to explain examples in the embodiments, sizes of figures do not always comply with magnification in the examples.

Figure 2:
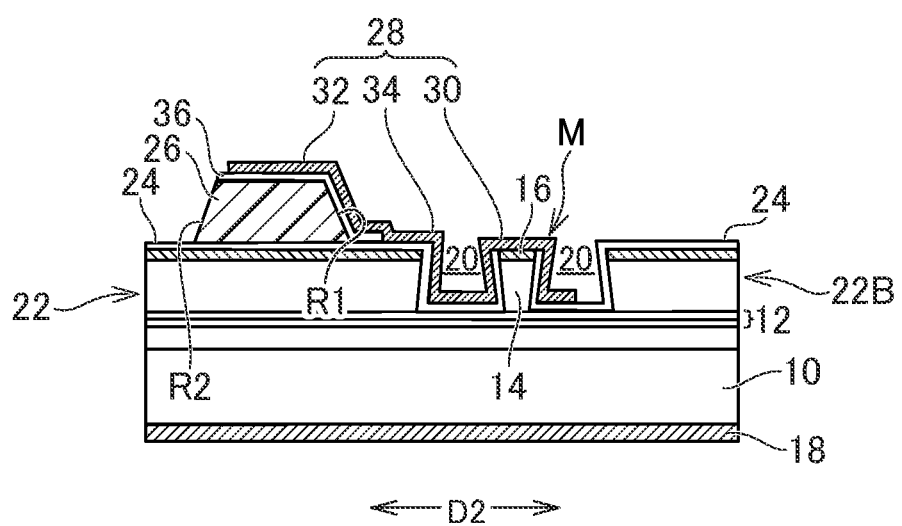
FIG. 2 is a cross-sectional view taken along line II-II of the semiconductor optical device illustrated in FIG. 1.

FIG. 1 is a plan view of a semiconductor optical device. FIG. 2 is a cross-sectional view taken along line II-II of the semiconductor optical device illustrated in FIG. 1. A semiconductor optical device 100 is a ridge waveguide type semiconductor laser.

The semiconductor optical device 100 includes a semiconductor substrate 10 (for example, an n-type InP substrate). A plurality of layers are laminated on the semiconductor substrate 10. The plurality of layers include, for example, an active layer 12, a cladding layer 14, and a contact layer 16. There may be other semiconductor layers (for example, a light confinement layer, an etching stop layer, and a diffraction grating layer) between the active layer 12 and the cladding layer 14. A lower electrode 18 (for example, a cathode) is provided on a back surface of the semiconductor substrate 10.

The plurality of layers include a pair of grooves 20 extending in a first direction D1. The pair of grooves 20 is formed by etching the layers above the active layer 12 in the plurality of layers. A mesa stripe structure M is formed between the pair of grooves 20.

The semiconductor optical device 100 includes the mesa stripe structure M. The mesa stripe structure M is composed of a laminate of parts of the respective plurality of layers. The mesa stripe structure M extends in a stripe shape on the semiconductor substrate 10 in the first direction D1. The mesa stripe structure M includes a contact layer 16 on the top layer.

The semiconductor optical device 100 includes an adjacent layer 22. The adjacent layer 22 is on the semiconductor substrate 10. The adjacent layer 22 is adjacent to one of the pair of grooves 20, contrary to the mesa stripe structure M. The adjacent layer 22 is composed of a laminate of other parts of the respective plurality of layers. The adjacent layer 22 is adjacent to the mesa stripe structure M in a second direction D2 orthogonal to the first direction D1.

The semiconductor optical device 100 further includes another adjacent layer 22B. The adjacent layer 22B has the same structure in a thickness direction as the adjacent layer 22, but has a different planar size. The mesa stripe structure M sandwiched between the pair of grooves 20 is disposed between the adjacent layer 22 and the adjacent layer 22B. The adjacent layer 22 and the adjacent layer 22B protect the mesa stripe structure M on both sides.

The semiconductor optical device 100 includes a passivation film 24. The passivation film 24 is made of, for example, $SiO_2$. The passivation film 24 covers at least a part of the adjacent layer 22. The passivation film 24 covers the whole plurality of layers except the contact layer 16. The passivation film 24 extends from the adjacent layer 22 to a side surface of the mesa stripe structure M through one of the pair of grooves 20. The passivation film 24 covers at least a part of the adjacent layer 22B. The passivation film 24 extends from the adjacent layer 22B to the side surface of the mesa stripe structure M through the other of the pair of grooves 20. The passivation film 24 is formed to avoid at least a part (for example, the entire top surface) of the contact layer 16.

The semiconductor optical device 100 has a resin layer 26. The resin layer 26 is made of resin such as polyimide having a dielectric constant lower than that of the cladding layer 14. The resin layer 26 is on the passivation film 24. The resin layer 26 includes a side surface. The side surface is inclined. The side surface of the resin layer 26 includes a first region R1 near the mesa stripe structure M. The side surface of the resin layer 26 includes a second region R2 opposite to the mesa stripe structure M. The side surface of the resin layer 26 includes a third region R3 between the first region R1 and the second region R2. The resin layer 26 includes the top surface surrounded by the side surface. The top surface may be rectangular or circular. The top surface of the resin layer 26 is higher than the surface of the passivation film 24.

The semiconductor optical device 100 includes an upper electrode 28. The upper electrode 28 is composed of, for example, a three-layer structure of Ti, Pt, and Au. The upper electrode 28 includes a mesa electrode 30 positioned on the mesa stripe structure M. The mesa electrode 30 overlaps and contacts the contact layer 16 for conduction. The upper electrode 28 extends continuously from the contact layer 16 to the resin layer 26.

The upper electrode 28 includes a pad electrode 32 positioned on the top surface of the resin layer 26. The pad electrode 32 is a region for bonding a wire (not illustrated) for electrical connection with outside. Since the resin layer 26 is interposed below the pad electrode 32, parasitic capacitance due to the pad electrode 32 can be reduced.

The upper electrode 28 includes a bridge electrode 34 formed between the mesa electrode 30 and the pad electrode 32. The bridge electrode 34 passes through the side surface (first region R1) of the resin layer 26, passes through the region between the resin layer 26 and the pair of grooves 20, passes through one of the pair of grooves 20, and reaches the mesa electrode 30. At least the passivation film 24 is below the bridge electrode 34.

The semiconductor optical device 100 includes an inorganic insulating film 36. The inorganic insulating film 36 is made of a material (for example, SiN) different from the passivation film 24. The inorganic insulating film 36 covers the entire top surface of the resin layer 26. The inorganic insulating film 36 is completely interposed between the upper electrode 28 and the resin layer 26. That is, the upper electrode 28 is not in contact with the resin layer 26 by the inorganic insulating film 36.

When the pad electrode 32 and the resin layer 26 are in direct contact, adhesion may not be sufficient, and there is a concern that the pad electrode 32 may be peeled off by bonding of a wire (not illustrated). Therefore, it is effective that the inorganic insulating film 36 is interposed between the pad electrode 32 and the resin layer 26. The inorganic insulating film 36 is interposed between the pad electrode 32 and the bridge electrode 34 and the resin layer 26, thereby capable of strengthening adhesion between the resin layer 26 and the upper electrode 28. By forming the inorganic insulating film 36 to cover the resin layer 26 after forming the resin layer 26 in a mountain shape, a step that causes disconnection of the upper electrode 28 is eliminated, and deterioration of the characteristics and reliability can be avoided.

The inorganic insulating film 36 extends continuously from the resin layer 26 to the passivation film 24 under the upper electrode 28. The inorganic insulating film 36 covers a portion of the passivation film 24 adjacent to the resin layer 26. The inorganic insulating film 36 is also provided between the bridge electrode 34 and the passivation film 24. From a viewpoint of eliminating the step described above, the inorganic insulating film 36 may cover only a region (that is, a region extending to the lower end of the side surface) where the resin layer 26 does not exist. However, in a design in which the inorganic insulating film 36 is provided just at the lower end of the side surface, the inorganic insulating film 36 may be interrupted in the middle of the side surface due to a manufacturing error. Therefore, a part of the inorganic insulating film 36 is extended onto the passivation film 24 with a margin.

The inorganic insulating film 36 is spaced apart from the mesa stripe structure M. Therefore, the passivation film 24 is exposed from the inorganic insulating film 36 at a portion away from the resin layer 26 in the direction approaching the mesa stripe structure M. In the region where the inorganic insulating film 36 and the passivation film 24 overlap, both the inorganic insulating film 36 and the passivation film 24 are harder than the semiconductor, and thus they may cause stress and lead to deterioration in reliability and characteristics. Therefore, the passivation film 24 is not covered by the inorganic insulating film 36 near the mesa stripe structure M.

The inorganic insulating film 36 covers only a part of the surface of the resin layer 26. The inorganic insulating film 36 avoids overlapping with a part of the side surface of the resin layer 26. The inorganic insulating film 36 covers the first region R1 of the resin layer 26 while avoiding overlapping with the second region R2 of the resin layer 26. The inorganic insulating film 36 avoids overlapping with the third region R3 of the resin layer 26. In the second region R2 and the third region R3 in which the bridge electrode 34 is not provided, disconnection of the upper electrode 28 is not a problem, the inorganic insulating film 36 is not provided in order to reduce the stress on the entire semiconductor optical device 100.

Figure 3:
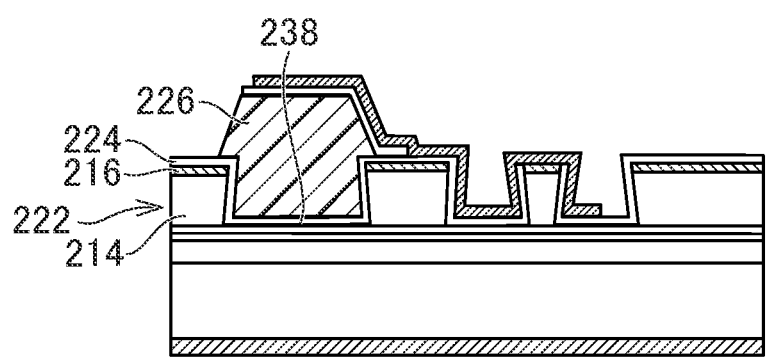
FIG. 3 is a cross-sectional view of the semiconductor optical device illustrated in FIG. 2.

FIG. 3 is a cross-sectional view of the semiconductor optical device illustrated in FIG. 2. In the modified example, an adjacent layer 222 includes a recess 238 on the top surface. The recess 238 is formed by scraping a contact layer 216 and a cladding layer 214. The inner surface of the recess 238 is covered with a passivation film 224. A resin layer 226 is disposed in the recess 238 and is also on the passivation film 224.

The resin layer 226 is thicker than a depth of the recess 238. A thickness of the resin layer 226 is larger than a distance from the top surface of the passivation film 224 in the recess 238 to the top surface of the passivation film 224 around the recess 238. The resin layer 226 is placed on the passivation film 224 around the recess 238. The resin layer 226 is higher than the passivation film 224 around the recess 238. It is possible to further reduce parasitic capacitance by forming the resin layer 226 thick.

Figure 4:
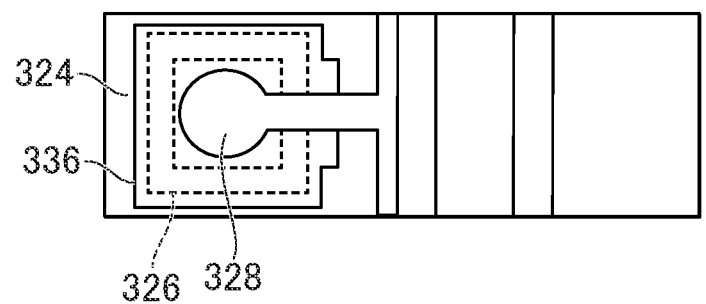
FIG. 4 is a plan view of the semiconductor optical device illustrated in FIG. 1.
Figure 5:
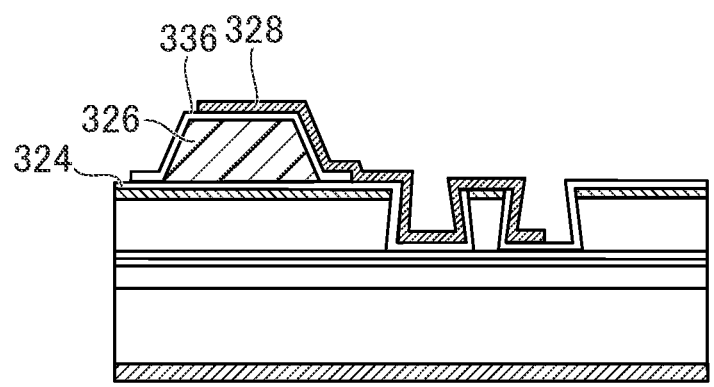
FIG. 5 is a cross-sectional view taken along line V-V of the semiconductor optical device illustrated in FIG. 4.

FIG. 4 is a plan view of the semiconductor optical device illustrated in FIG. 1. FIG. 5 is a cross-sectional view taken along line V-V of the semiconductor optical device illustrated in FIG. 4. In the modified example, an inorganic insulating film 336 covers the entire surface of the resin layer 326.

Specifically, the inorganic insulating film 336 is a shape that covers the entire top surface and the entire side surface of the resin layer 326. The inorganic insulating film 336 is further placed on the passivation film 324 around the resin layer 326. Since the entire resin layer 326 is covered with the inorganic insulating film 336, deformation of the resin layer 326 in a formation process can be prevented. Since the resin layer 326 is not etched after being patterned, the resin layer 326 can maintain its shape more stably without generating a step, and can eliminate a possibility of the upper electrode 328 being disconnected or the like.

Figure 6:
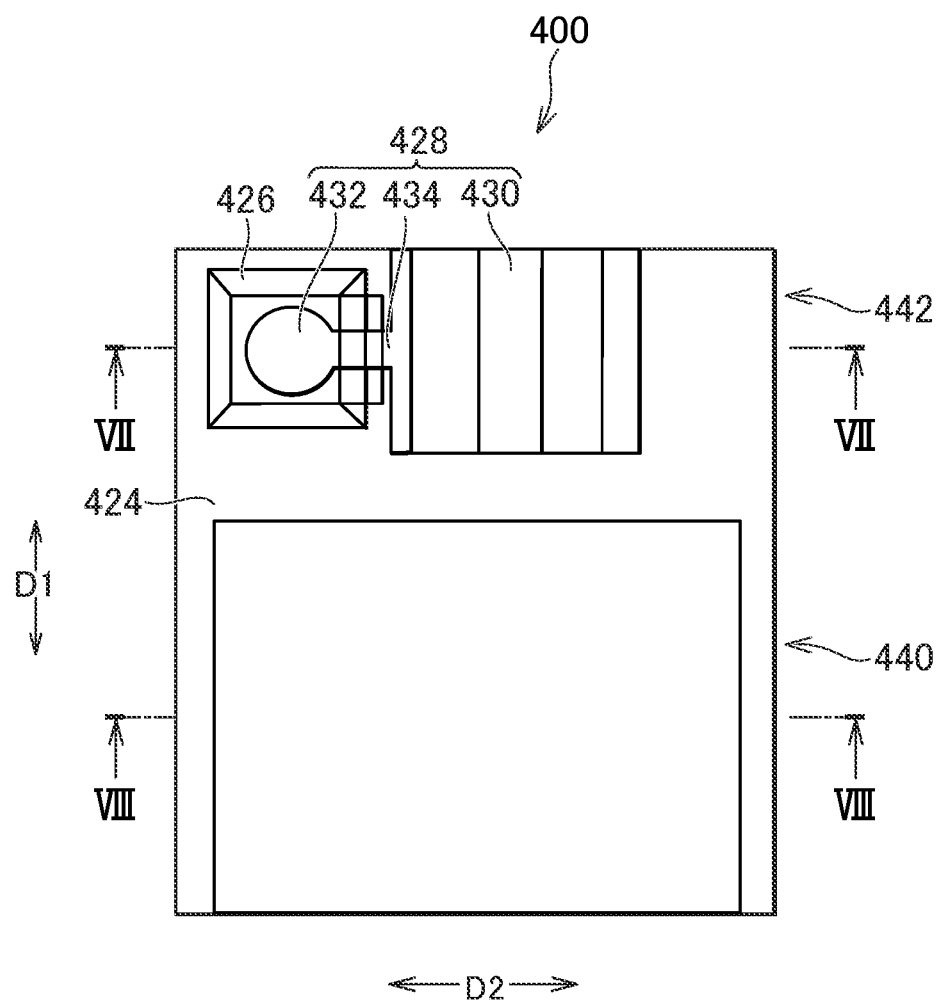
FIG. 6 is a plan view of a semiconductor optical device.
Figure 7:
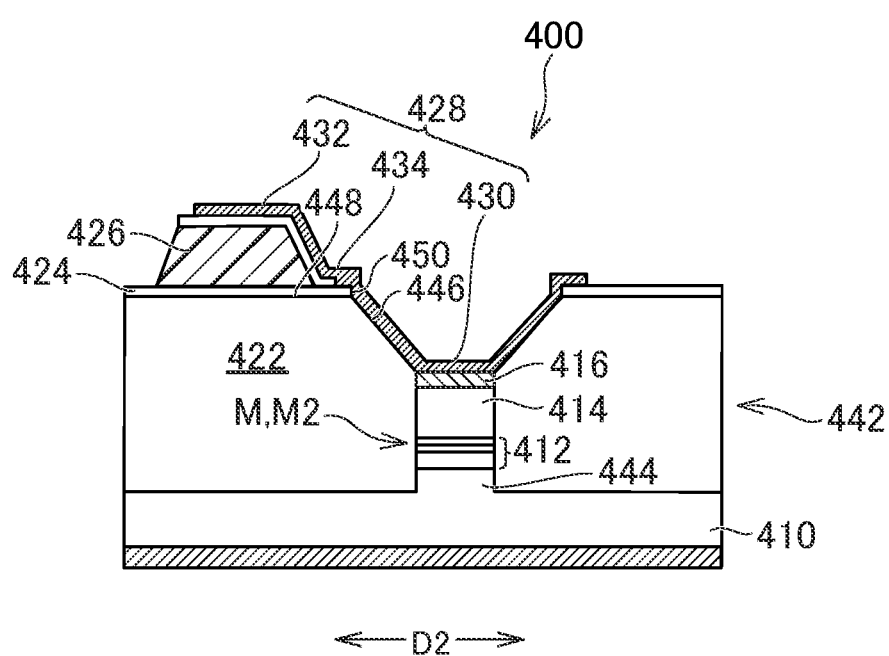
FIG. 7 is a cross-sectional view taken along line VII-VII of the semiconductor optical device illustrated in FIG. 6.
Figure 8:
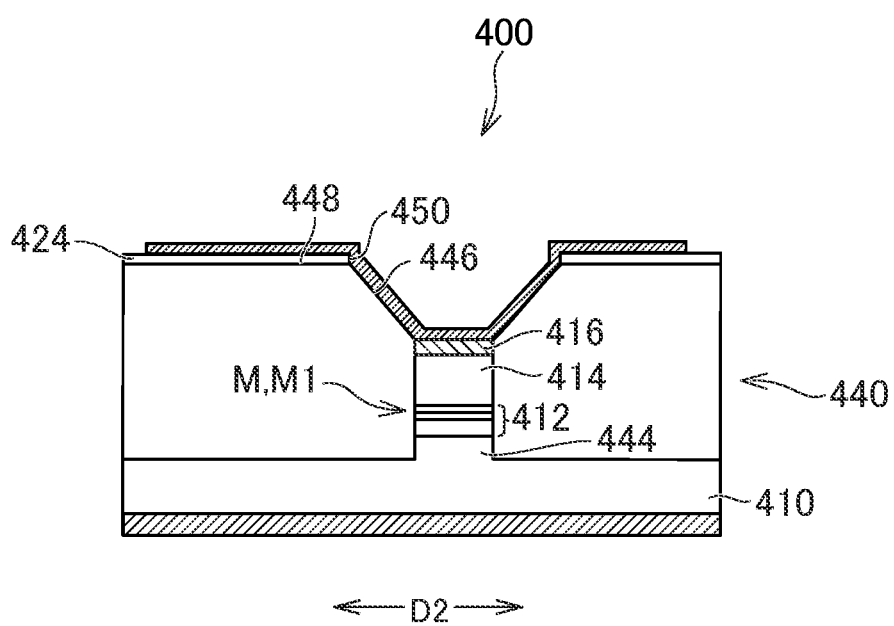
FIG. 8 is a cross-sectional view taken along line VIII-VIII of the semiconductor optical device illustrated in FIG. 6.

FIG. 6 is a plan view of a semiconductor optical device. FIG. 7 is a cross-sectional view taken along line VII-VII of the semiconductor optical device illustrated in FIG. 6. FIG. 8 is a cross-sectional view taken along line VIII-VIII of the semiconductor optical device illustrated in FIG. 6.

In a semiconductor optical device 400, continuous light, which is emitted by injecting a drive current into a laser portion 442, is modulated by a modulator portion 442 and signal light is output. The semiconductor optical device 400 is a modulator integrated semiconductor optical device (for example, modulator integrated laser) in which the laser portion 440 (for example, semiconductor laser) and the modulator portion 442 are monolithically integrated on the same semiconductor substrate 410.

The laser portion 440 is a distributed feedback semiconductor laser (DFB laser). The modulator portion 442 is an electro-absorption modulator (EA modulator). In addition to having advantageous properties of a small chirp (wave modulation), a large extinction ratio, which is the difference between the ON level and the OFF level of an optical signal, and a broad band, the electro-absorption modulator is widely used due to its small size and low cost. The semiconductor optical device 400 is an EA modulator integrated DFB laser device.

The semiconductor optical device 400 has a buried heterostructure (BH structure). The BH structure refers to a structure in which a semi-insulating semiconductor layer (adjacent layer 422) is buried on both sides of the mesa stripe structure M having an optical waveguide. The BH structure has a strong effect of confining light in the lateral direction and the far field pattern (FFP) becomes more circular in the BH structure, and thus the BH structure has the advantage of high coupling efficiency with the optical fiber, and further has excellent heat dissipation and is widely used.

The semiconductor optical device 400 includes the semiconductor substrate 410. The semiconductor substrate 410 is made of a semiconductor (for example, n-type InP) doped with n-type impurities. The semiconductor substrate 410 includes a protrusion 444. The protrusion 444 extends in a stripe shape in the first direction D1. The protrusion 444 constitutes at least a lower end portion of the mesa stripe structure M.

The mesa stripe structure M includes a first mesa stripe structure M1 for constituting the laser portion 440 (semiconductor laser). The mesa stripe structure M includes a second mesa stripe structure M2 for constituting the modulator portion 442.

The semiconductor optical device 400 has a quantum well layer 412 extending in a stripe shape in the first direction D1 on the protrusion 444. The quantum well layer 412 is made of an intrinsic semiconductor not doped with p-type or n-type impurities. The quantum well layer 412 constitutes a part of the mesa stripe structure M. In the semiconductor laser (first mesa stripe structure M1), the quantum well layer 412 is an active layer. In the modulator portion 442 (second mesa stripe structure M2), the quantum well layer 412 is an absorption layer. The quantum well layer 412 is a multiple-quantum well (MQW) layer. When an electric field is applied to the MQW layer, a quantum confinement Stark effect (QCSE) in which an absorption edge of light in the MQW layer is shifted to the long wavelength side is obtained. The EA modulator modulates light using QCSE. The MQW layer includes a plurality of quantum well layers 412 (InGaAsP) with strain introduced and barrier layers each of which is interposed between adjacent quantum well layers 412.

Above and below the quantum well layer 412, light guide layers (not illustrated) made of InGaAsP are provided. The quantum well layer 412 (active layer) of the laser portion 440 and the quantum well layer 412 (absorption layer) of the modulator portion 442 are optically connected by a butt joint. In the laser portion 440, a diffraction grating layer made of InGaAsP is provided on the quantum well layer 412 (active layer).

The mesa stripe structure M includes a cladding layer 414 extending in a stripe shape in the first direction D1 on the quantum well layer 412 (the diffraction grating layer in the laser portion 440). The cladding layer 414 is made of a semiconductor (p-type InP) doped with zinc (Zn), which is p-type impurities. The mesa stripe structure M includes a contact layer 416. The contact layer 416 is composed of a p-type InGaAsP layer and a p-type InGaAs layer, and each layer is doped with p-type impurities (Zn).

The semiconductor optical device 400 includes an adjacent layer 422 as a buried layer. The adjacent layer 422 is made of a semiconductor (for example, InP) doped with iron (Fe). InP to which Fe is added is a semi-insulating semiconductor. The adjacent layer 422 is placed on the top surface of the semiconductor substrate 410. The adjacent layer 422 is adjacent to each of both sides of the mesa stripe structure M in the second direction D2 orthogonal to the first direction D1 and constitutes a buried heterostructure. The semiconductor optical device 400 is a mesa stripe type.

The adjacent layer 422 includes an inclined surface 446 adjacent to the top surface of the mesa stripe structure M and inclined along the plane orientation of (111) plane. The inclined surface 446 is sloped upward in a direction away from the mesa stripe structure M. The adjacent layer 422 includes a flat surface 448 outside the inclined surface 446 and extending parallel to the horizontal surface.

The mesa stripe structure M and the adjacent layer 422 are covered with a passivation film 424. The passivation film 424 includes a through-hole 450. In the through-hole 450, the top surface of the mesa stripe structure M (contact layer 416) is exposed, and a part (inclined surface 446) of the top surface of the adjacent layer 422 is also exposed adjacent to thereto. The passivation film 424 avoids overlapping with the inclined surface 446.

The resin layer 426 is provided on the adjacent layer 422 and on the passivation film 424 in the modulator portion 442. In contrast, a resin layer is not provided in the laser portion 440. The reason is that since a DC voltage to emit continuous light is applied to the laser portion 440, the influence by parasitic capacitance is small in the laser portion 440.

An upper electrode 428 of the modulator portion 442 is placed on the passivation film 424. The upper electrode 428 is electrically connected to the contact layer 416 in the through-hole 450. The upper electrode 428 includes a mesa electrode 430, a pad electrode 432 and a bridge electrode 434. The semiconductor optical device 400 includes an antireflection film (not illustrated) on an end surface from which light is emitted, and includes a high reflection film (not illustrated) on an end surface of a side opposite to the end surface.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor optical device comprising:
   a semiconductor substrate;
   a mesa stripe structure that extends in a stripe shape in a first direction on the semiconductor substrate and includes a contact layer;
   an adjacent layer on the semiconductor substrate and adjacent to the mesa stripe structure in a second direction orthogonal to the first direction;
   a passivation film that covers at least a part of the adjacent layer;
   a resin layer on the passivation film;
   an electrode that is electrically connected to the contact layer and extends from the contact layer to the resin layer; and
   an inorganic insulating film that extends from the resin layer to the passivation film under the electrode and is interposed between the electrode and the resin layer,
   wherein the inorganic insulating film has a length along the second direction that is less than a length of the electrode along the second direction.

2. The semiconductor optical device according to claim 1, wherein:
   a plurality of layers are laminated on the semiconductor substrate,
   the plurality of layers include a pair of grooves extending in the first direction,
   the mesa stripe structure is between the pair of grooves and includes a laminate of parts of the plurality of layers, and
   the adjacent layer is adjacent to one groove of the pair of grooves opposite to the mesa stripe structure and includes a laminate of other parts of the plurality of layers.

3. The semiconductor optical device according to claim 2, wherein the passivation film extends from the adjacent layer through the pair of grooves to a side surface of the mesa stripe structure.

4. The semiconductor optical device according to claim 1, wherein the adjacent layer is adjacent to the mesa stripe structure and constitutes a buried heterostructure.

5. The semiconductor optical device according to claim 1, wherein:
   the adjacent layer includes an inclined surface sloped upward in a direction away from the mesa stripe structure, and
   the passivation film does not overlap with the inclined surface.

6. The semiconductor optical device according to claim 1, wherein the inorganic insulating film covers only a part of the resin layer.

7. The semiconductor optical device according to claim 1, wherein:
   the resin layer includes a side surface and a top surface surrounded by the side surface, and
   the inorganic insulating film does not overlap with a part of the side surface.

8. The semiconductor optical device according to claim 7, wherein:
   the side surface of the resin layer includes a first region next to the mesa stripe structure and a second region opposite to the mesa stripe structure, and
   the inorganic insulating film covers the first region and does not overlap with the second region.

9. The semiconductor optical device according to claim 8, wherein"

the side surface of the resin layer further includes a third region between the first region and the second region, and the inorganic insulating film does not overlap with the third region.

10. The semiconductor optical device according to claim 7, wherein the inorganic insulating film covers an entirety of the top surface.

11. The semiconductor optical device according to claim 1, wherein the inorganic insulating film covers an entire surface of the resin layer.

12. The semiconductor optical device according to claim 1, wherein the passivation film is covered with the inorganic insulating film at a portion adjacent to the resin layer and is exposed from the inorganic insulating film at a portion separated from the resin layer in a direction approaching the mesa stripe structure.

13. The semiconductor optical device according to claim 1, wherein:
the adjacent layer includes a recess,
the passivation film is disposed to reach the recess, and
the resin layer is on the recess.

14. A semiconductor optical device comprising:
a mesa stripe structure that includes a contact layer;
an adjacent layer adjacent to the mesa stripe structure;
a passivation film on the adjacent layer;
a resin layer on the passivation film;
an electrode that is electrically connected to the contact layer and extends from the contact layer to the resin layer along a direction; and
an inorganic insulating film that extends from the resin layer to the passivation film under the electrode,
wherein the inorganic insulating film has a length along the direction that is less than a length of the electrode along the direction.

15. The semiconductor optical device according to claim 14, wherein the adjacent layer includes an inclined surface sloped upward in a direction away from the mesa stripe structure.

16. The semiconductor optical device according to claim 14, wherein the inorganic insulating film covers only a part of the resin layer.

17. The semiconductor optical device according to claim 14, wherein the inorganic insulating film does not overlap with a part of a side surface of the resin layer.

18. The semiconductor optical device according to claim 17, wherein:
the side surface of the resin layer includes a first region next to the mesa stripe structure and a second region opposite to the mesa stripe structure, and
the inorganic insulating film covers the first region and does not overlap with the second region.

19. The semiconductor optical device according to claim 18, wherein:
the side surface of the resin layer further includes a third region between the first region and the second region, and
the inorganic insulating film does not overlap with the third region.

20. The semiconductor optical device according to claim 14, wherein:
the adjacent layer includes a recess,
the passivation film is disposed to reach the recess, and
the resin layer is on the recess.

\* \* \* \* \*